(12) United States Patent
Eschenweck

(10) Patent No.: US 6,901,311 B2
(45) Date of Patent: May 31, 2005

(54) DEVICE FOR CHARACTERIZING COMPONENT STORES AND METHOD FOR USING SAID DEVICE

(75) Inventor: Friedrich Eschenweck, Feldkirchen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/475,178

(22) PCT Filed: Apr. 3, 2002

(86) PCT No.: PCT/DE02/01210

§ 371 (c)(1),
(2), (4) Date: Oct. 17, 2003

(87) PCT Pub. No.: WO02/087302

PCT Pub. Date: Oct. 31, 2002

(65) Prior Publication Data

US 2004/0148762 A1 Aug. 5, 2004

(30) Foreign Application Priority Data

Apr. 19, 2001 (DE) .......................................... 101 19 232

(51) Int. Cl.$^7$ ................................................. G06F 7/00
(52) U.S. Cl. ...................................... 700/220; 700/225
(58) Field of Search ................................ 700/220, 221, 700/225, 226, 95, 99, 102

(56) References Cited

U.S. PATENT DOCUMENTS 4,787,143 A * 11/1988 Yagi et al. .................... 29/833
6,288,443 B1 * 9/2001 Finn et al. .................... 257/678
6,332,536 B2 * 12/2001 Easton ....................... 206/459.5
6,415,977 B1 * 7/2002 Rumsey ....................... 235/454
6,778,878 B1 * 8/2004 Kou ............................ 700/221
6,779,726 B1 * 8/2004 Easton ................... 235/462.01

FOREIGN PATENT DOCUMENTS

| DE | 19804594 | 8/1999 |
|---|---|---|
| DE | 29919674 | 5/2000 |
| WO | WO0067546 | 11/2000 |

* cited by examiner

Primary Examiner—Gene O. Crawford
(74) Attorney, Agent, or Firm—Harness, Dickey & Pierce, P.L.C.

(57) ABSTRACT

A device and method are for characterising component carriers provided with a plurality of electrical components to be fitted. The device includes at least one data carrier which is coupled to the components to be fitted, and in which at least technical data of the components is stored. The data carrier can be detected and read, and is designed in such a way that it can store other technical component data, logistical component data and/or operating data of the fitting installation. It is thus possible to take into account all operating states of a fitting installation, defective components, defective fitting processes, etc. during a fitting process in a fitting program, and/or to evaluate the corresponding data, and use it for optimizing and improving the fitting process.

28 Claims, 2 Drawing Sheets

DEVICE FOR CHARACTERIZING COMPONENT STORES AND METHOD FOR USING SAID DEVICE

This application is the national phase under 35 U.S.C. § 371 of PCT International Application No. PCT/DE02/01210 which has an International filing date of Apr. 3, 2002, which designated the United States of America and which claims priority on German Patent Application number DE 101 19 232.0 filed Apr. 19, 2001, the entire contents of which are hereby incorporated herein by reference.

FIELD OF THE INVENTION

The invention generally relates to a device for characterizing component magazines provided with a plurality of electrical components to be inserted. In particular, it relates to a device for component insertion machines (pick-and-place tools) including conveyor devices, insertion heads and feeder modules for inserting electrical components, and a method for using the device.

BACKGROUND OF THE INVENTION

DE 199 40 584 A1 discloses a method and a system for inserting components onto circuit carriers disposed in a component insertion unit in which electronic components are held in readiness in a container and the container is allocated to specific feeder tracks of the component insertion unit in such a way that in each case component-related data on identification media assigned to the containers is compared with the data contained on so-called machine setup control media. By this, correct and reliable control over the assignment is achieved.

An automatic placement machine is known from JP 8-264994 A and a method for loading printed circuit boards with electronic components is known from JP 7-76364 A, wherein a barcode attached to a component tape is used to characterize the electronic components contained in the component tape.

It is known from DE 25 57 110 A1 and from GB 2 287 860 A that components to be inserted can also be characterized and identified in such a way that the characterization or an identification attribute can be attached directly to the individual component.

DE 199 19 915.9 discloses a method and a device for placing components onto substrates as well as a substrate, wherein the substrate is provided with a transponder in which data relating to the components placed on the substrate can be stored and read.

With this method, following insertion of the components, data relating to the insertion process is transferred by means of a control device via a communication unit into a contactless data storage unit located in or on the substrate. The data is stored in the data storage unit and read out by a readout unit, as well as being drawn upon for an evaluation of the insertion process by means of a control unit. With this known solution it furthermore cannot be ensured that the component types provided in an insertion program for the insertion process to be performed are held in readiness in the feeder devices of an automatic placement machine.

According to DE 198 04 594 a tablet-shaped component magazine has become known in which the components are accommodated distributed in two coordinate directions in corresponding pockets of the magazine so as to be randomly accessible. A transponder is disposed in one of the pockets in place of one of the components and is writ-ten with the specific type data of the components. Owing to the free accessibility of the pockets the transponder data can be read out without problem at any time.

With this method it is possible in the case of the associated component insertion device and the corresponding substrate to process information about the quantities of electrical components and types of electrical components still available on an automatic placement machine in an insertion process, as well as to carry out a unique assignment of the processed components to the populated substrates.

When components stored in tape magazines are used there is the problem that a transponder placed at the beginning of the tape and therefore easily accessible would have to be removed already at the start of the processing, with the result that if an already partially used tape were to be used no identification would be possible. Furthermore, for an optimal execution of an insertion process it is necessary to change the magazines correspondingly promptly to ensure that no downtimes occur.

SUMMARY OF THE INVENTION

An object of an embodiment of the invention is therefore to specify a device and a method by which the insertion process can be performed more easily, more reliably and more quickly using components stored in tape magazines.

An object may be achieved by a device and a method.

According to an embodiment of the invention, a device is created for characterizing component magazines provided with a plurality of electrical components to be inserted. This is suitable in particular for pick-and-place tools including conveyor devices, insertion heads and feeder modules for inserting electrical components and has at least one data medium linked to the components to be inserted, at least technical data relating to the components being stored in said data medium. The data medium is detectable by use of a processing unit. Other technical component data, logistical component data and/or operating data of the pick-and-place tool may be stored in or written to the data medium.

The component magazine has a plurality of recesses for accommodating components. In one of the recesses there is disposed the data medium which is implemented according to an embodiment of the invention as a transponder. By way of the device according to an embodiment of the invention, it is possible to uniquely identify components made available in feeder modules of a pick-and-place tool and to verify whether the components made available correspond to the components provided in an insertion program for an insertion process to be performed. It is also possible by way of the device according to an embodiment of the invention to record and analyze error logs and/or a log of the entire execution of the insertion process of the pick-and-place tool.

According to an embodiment of the invention, with the pick-and-place tools in which components can be removed successively from tape-like component magazines, the data medium is disposed in proximity to the end of the magazine. It is usual that the vast majority of the components are supplied in such tape magazines. The transponder assigned to the end of the tape is thus located in the not easily accessible inner region of the tape reel where it can be scanned for example with the aid of a manually movable read device which is connected to the pick-and-place tool.

The transponder is disposed at the end of the tape in such a way that it can be detected by way of a detection device before the last component is removed from the component magazine linked to the data medium. In this way it is ensured, in addition to the monitoring of the number of components remaining in the component magazine, that a signal can be sent to a control device which controls the insertion process before the last component is removed from a component magazine. By detecting the data medium in this manner it can be ensured that the feeder devices of the pick-and-place tool can be provided with a new component magazine in a timely fashion.

The component magazine can be a component tape for example. This offers the advantage that no separate retaining device needs to be provided for the data medium. For example, the data medium can be disposed in proximity to the end of tape of a component tape in one of the last recesses of the component tape. The data medium can have an antenna. The antenna can, for example, be disposed in the recess in which the data medium is also disposed. It is also possible that the antenna extends over a number of recesses on the component tape.

The data medium can be linked to the components for example by being attached to the component magazine. It is however also possible that the data medium is integrated in the components themselves. There are also other possibilities of linking the data medium according to an embodiment of the invention to the component magazines which ensure a fixed assignment between data medium and component. By linkage it is possible to achieve a unique assignment of component types to feeder modules of a pick-and-place tool. Furthermore, data on physical characteristics of the components, such as for example quality and proneness to defects, etc. of the components, can be stored in the data medium and tracked during the entire insertion process as a result of the link between data medium and component.

The operating data can also include statistics on the number of components remaining in the component magazine, information concerning the operation of the pick-and-place tool, and/or technical specifications of the pick-and-place tool. In particular the following information can be stored on the data medium: number of components in a full component magazine, technical data on the components, such as, for example, type, value, size, tolerance, temperature coefficient or date of manufacture, information about the component magazine, about the type of the component magazine, about the spacing of the components in the component magazine, about the dimensions of the storage locations of the components in the component magazine, information about the manufacturer, about the batch, about the date of receipt of the goods, the supplier number, about internal designations for component types or package designations of component types, the number of components still remaining in a partially emptied component magazine, as well as data on the feeder device, such as for example on the type of feeder device, the serial number of the feeder device, the number and type of faults that have occurred, as well as on time specifications, etc.

Also created according to an embodiment of the invention is a method for using the device according to an embodiment of the invention in which information stored on the data medium is read, the information read is analyzed by way of a control unit, and on the basis of the analyzed information the components are assigned to insertion locations provided in an insertion program on substrates to be loaded. At the same time, according to an embodiment of the invention a check can be performed during the analysis of the read information by way of the control unit to determine whether the component types provided for the insertion locations in the insertion program are present in the feeder modules of the insertion device. Depending on the type of data medium, information relating to the execution of the insertion of the components can be written into the data medium and/or component data relating to the components loaded onto the substrate can be written into the data medium. This enables irregularities and/or insertion errors that have occurred to be recorded and also the technical data relating to the components actually loaded onto the substrate during the insertion process to be checked.

It is possible to output an error message if, in particular with pick-and-place tools in which components can be removed successively from component magazines, the data medium has been detected by the detection device before the removal of the last component from the component magazine linked to the data medium. By way of the output error message it can be signaled that a new component magazine needs to be loaded in order to ensure continuous insertion during the insertion process.

After termination of the insertion process the number of components remaining in the respective component magazines can be written into the respective data media assigned to the component magazines. In this way, if the partially emptied component magazine is to be used further, precise planning of the next insertion operation is possible since the number of components present in an even only partially emptied component magazine can be read out at any time.

BRIEF DESCRIPTION OF THE DRAWINGS

The present invention will become more fully understood from the detailed description of preferred embodiments given hereinbelow and the accompanying drawings, which are given by way of illustration only and thus are not limitative of the present invention, and wherein.

DETAILED DESCRIPTION OF THE PREFERRED EMBODIMENTS

Figure 1:
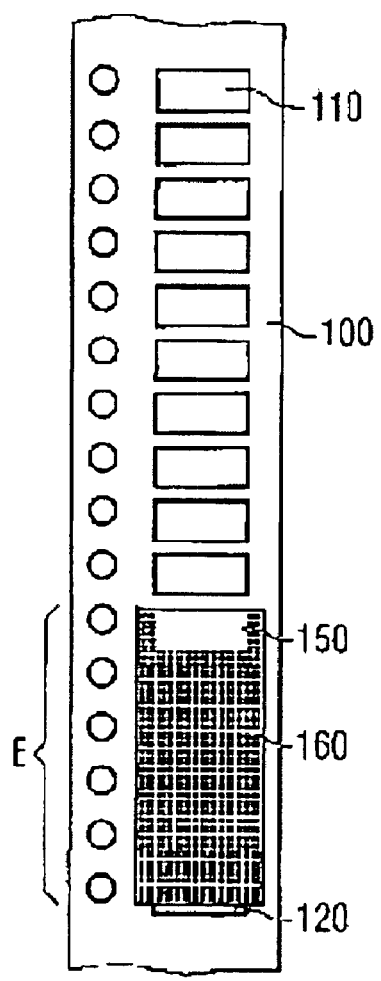
FIG. 1 shows a plan view of a first preferred embodiment of the invention.

As can be seen from FIG. 1, the first preferred embodiment according to an embodiment of the invention has a data medium 150 with an antenna 160. The antenna 160 can be adhesively attached, for example as a film antenna. The data medium 150 is disposed in a recess 120 of a component tape 100. A plurality of components 110 in recesses 120 is disposed in the component tape 100. The antenna 160 linked to the data medium 150 extends across a plurality of recesses 120 of the component tape 100 and is disposed on the latter's surface. The data medium 150 and the antenna 160 can be disposed for example in the end area E of the component tape 100, with the result that a detection of the data medium 150 can serve as a signal for an impending change of the component tape 100.

Figure 2:
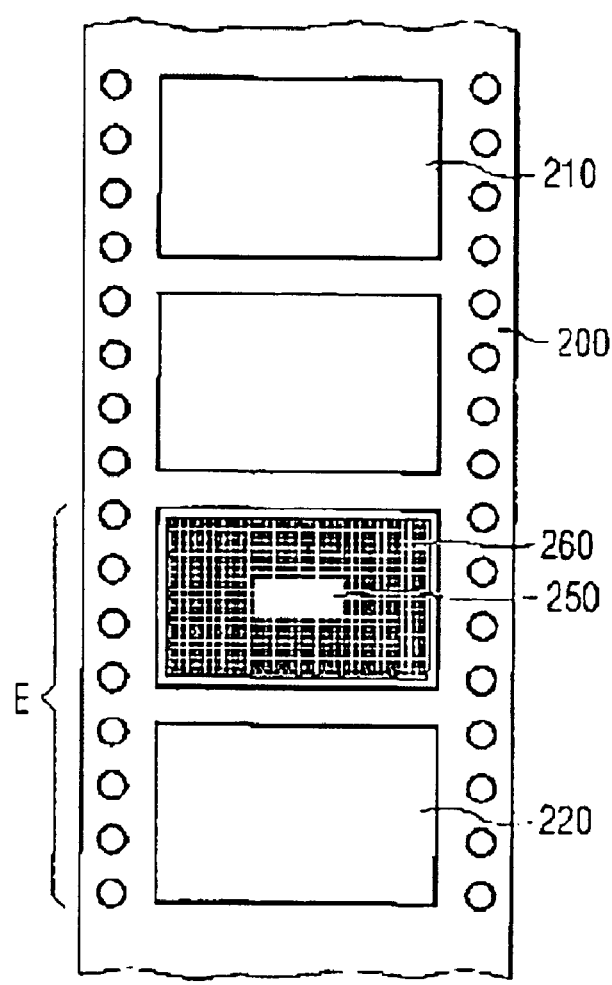
FIG. 2 shows a plan view of a second preferred embodiment of the invention.

FIG. 2 shows a second preferred embodiment according to an embodiment of the invention. The second preferred embodiment of the invention is suitable in particular for use with wide component tapes 200, as can be seen in FIG. 2, which are provided with a plurality of components 210 in recesses 220. With wide component tapes 200, the recesses 220 are formed with greater width and have a greater cross-sectional area than in the case of narrow component tapes 100. This serves to accommodate larger components 210. The device according to the second preferred embodiment includes a data medium 250 as well as an antenna 260 linked to the data medium 250. These are suitable for being disposed in one of the recesses 220 of the component tape 200, for example in an end area E of the component tape 200. In this case the antenna 260 can take the form of a film antenna or a flat coil.

In order to enable detection of the data medium 150 or 250 the component tape 100 or 200 can be guided through a, for example, ring-shaped receive antenna of a processing unit. Given suitably selected sensitivity of the antenna of the processing unit and/or of the antenna which is linked to the data medium 150 or 250, it is possible for data transfers between the data medium 150 or 250 and the processing unit (not shown) to be performed only in immediate proximity to the antenna of the processing unit.

Figure 3:
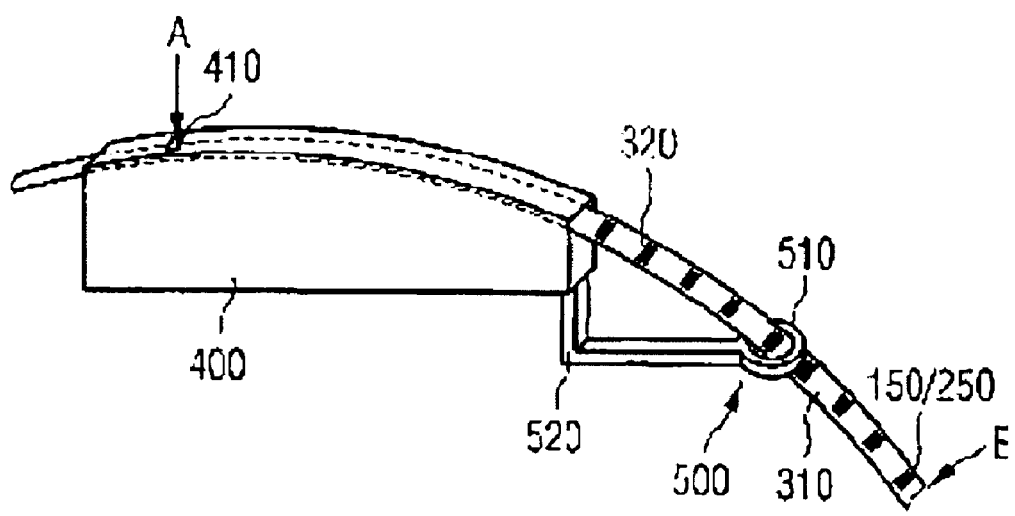
FIG. 3 shows a perspective view of a further embodiment of the invention.

FIG. 3 shows a perspective view of a further development according to an embodiment of the invention. At a feeder module 400 of an insertion de-vice (not shown), components 320 in a component tape 310 are made available at a retrieval position A for removal by way of a handling device (not shown).

The components 320 can be removed through a window 410 on the top side of the feeder module 400, the aperture of said window corresponding to the retrieval position A. At least one data medium 150 or 250 is also disposed in the component tape 310, as described above with reference to the FIGS. 1 and 2.

Further provided is a ring-like antenna 500, through the ring aperture 510 of which the component tape 310 is guided toward the feeder module 400. The antenna 500 can be attached to the feeder module 400 by way of a support 520. The antenna 500 is linked for example to a control device by which the insertion device is also controlled. The data medium can therefore be detected by means of the antenna 500.

By suitable tuning of the sensitivity of the antenna 500 it is possible to enable the data medium 150 or 250 to be detected only in proximity to the antenna 500. The data medium 150 or 250 is disposed for example in an end area E of the component tape 310. If the data medium 150 or 250 is detected by the ring-like antenna 500, this event can trigger a message which, for example, instructs the user to ensure a full component tape is made ready for loading or which indicates that soon all components of the component tape in question will have been removed, with the aim of ensuring that downtimes of the insertion device are avoided.

A suitable choice for use as a data medium can for example be a transponder which can be written and read by a contactless device. A self-sustaining electronic semiconductor memory which can be read and written via contact pads is another possibility. Furthermore it is also possible to use as the data medium a barcode which can be attached directly to the component tape for example. The processing device or control device is embodied according to the type of data medium selected, so that it can communicate with the latter.

Exemplary embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. Device for characterizing a component magazine provided with a plurality of electrical components insertable by pick-and-place tools, comprising:

a plurality of conveyor devices;
a plurality of insertion heads; and
a plurality of feeder modules for inserting the electrical components, wherein at least one data medium is linked to the insertable components and is adapted to store at least technical data relating to the components, wherein the data medium is detectable by a processing unit, and wherein the component magazine includes a plurality of recesses for accommodating components and wherein the data medium, implemented as a transponder, is disposed in one of the recesses, wherein the device is for pick-and-place tools in which components are adapted to be removed successively from component magazines, wherein the data medium is disposed in such a way that it is detectable by a detection device before the last component is removed from the component magazine linked to the data medium.

2. Device according to claim 1, wherein the data medium is linked to the components by being attached to the component magazine.

3. Device according to claim 1, wherein the data medium is readable and writable by a contactless device.

4. Device according to claim 1, wherein the data medium is directly linked to the components.

5. Device according to claim 1, wherein the component carrier is a component tape.

6. Device according to claim 5, wherein a ring-like antenna is linked to the processing unit through which the component magazine is guided, and wherein the data medium is detectable in proximity to the antenna linked to the processing unit.

7. Device according to claim 1, wherein the data medium includes an antenna.

8. Device according to claim 7, wherein a ring-like antenna is linked to the processing unit through which the component magazine is guided, and wherein the data medium is detectable in proximity to the antenna linked to the processing unit.

9. Device according to claim 7, wherein the antenna is disposed in the recess in which the data medium is disposed.

10. Device according to claim 9, wherein a ring-like antenna is linked to the processing unit through which the component magazine is guided, and wherein the data medium is detectable in proximity to the antenna linked to the processing unit.

11. Device according to claim 7, wherein the antenna is disposed extending across a plurality of recesses on the component magazine.

12. Device according to claim 11, wherein a ring-like antenna is linked to the processing unit through which the component magazine is guided, and wherein the data medium is detectable in proximity to the antenna linked to the processing unit.

13. Device according to claim 1, wherein the data medium is writable.

14. Device according to claim 13, wherein the data medium is linked to the components by being attached to the component magazine.

15. Device according to claim 13, wherein the data medium is directly linked to the components.

16. Device according to claim 13, wherein the component carrier is a component tape.

17. Device according to claim 1, wherein the antenna is disposed extending across a plurality of recesses on component magazine.

18. Device according to claim 13, wherein the data medium includes an antenna.

19. Device according to claim 18, wherein the antenna is disposed in the recess in which the data medium is disposed.

20. Method for characterizing a component magazine provided with a plurality of electrical components to be inserted by pick-and-place tools for inserting the electrical components, comprising:

attaching a component magazine to a feeder module of a pick-and-place tool;

reading information stored on a data medium linked to the components to be inserted;

analyzing the information read; and assigning the components to insertion locations provided in an insertion program on substrates to be loaded, based on the analyzed information; and checking, on the basis of the analyzed information, whether the component types made available in the feeder modules correspond to the component types required on the basis of the insertion program;

starting the insertion operation when the correspondence of the component types is established; and outputting an error message if an inadequate or no correspondence was established.

21. Method according to claim 20, wherein a message is output if the data medium has been detected.

22. Method according to claim 20, wherein after completion of the insertion operation, the number of components remaining in each of the component magazines is written into the respective data media.

23. Method according to claim 20, wherein a message is output if the data medium has been detected.

24. Method according to claim 20, wherein after completion of the insertion operation, the number of components remaining in each of the component magazines is written into the respective data media.

25. Method according to claim 20, comprising at least one of:

writing information about the execution of the insertion of the components into the data medium; and writing component data relating to the components loaded onto the substrate into the data medium.

26. Method according to claim 25, wherein a message is output if the data medium has been detected.

27. Method according to claim 25, wherein after completion of the insertion operation, the number of components remaining in each of the component magazines is written into the respective data media.

28. Device for characterizing a component magazine provided with a plurality of electrical components insertable by pick-and-place tools, comprising:

a plurality of conveyor devices;

a plurality of insertion heads; and a plurality of feeder modules for inserting the electrical components, wherein at least one data medium is linked to the insertable components and is adapted to store at least technical data relating to the components, wherein the data medium is detectable by a processing unit, and wherein the component magazine includes a plurality of recesses for accommodating components and wherein the data medium, implemented as a transponder, is disposed in one of the recesses, wherein the data medium is directly linked to the components.

\* \* \* \* \*